US006914811B2

(12) United States Patent
Müller

(10) Patent No.: US 6,914,811 B2
(45) Date of Patent: Jul. 5, 2005

(54) METHOD OF DRIVING ONE-TIME OPERABLE ISOLATION ELEMENTS AND CIRCUIT FOR DRIVING THE ISOLATION ELEMENTS

(75) Inventor: Jochen Müller, München (DE)

(73) Assignee: Infineon Technologies AG, Munich (DE)

( * ) Notice: Subject to any disclaimer, the term of this patent is extended or adjusted under 35 U.S.C. 154(b) by 117 days.

(21) Appl. No.: 10/651,857

(22) Filed: Aug. 29, 2003

(65) Prior Publication Data

US 2004/0057270 A1 Mar. 25, 2004

(30) Foreign Application Priority Data

Aug. 29, 2002 (DE) .......................................... 102 39 857

(51) Int. Cl.[7] .............................................. G11C 16/04
(52) U.S. Cl. .......................... 365/185.01; 365/185.09; 365/225.7; 365/230.06
(58) Field of Search ...................... 365/185.01, 185.09, 365/225.7, 230.06

(56) References Cited

U.S. PATENT DOCUMENTS

| 5,299,160 | A | * | 3/1994 | Mori ........................... 365/201 |
| 5,414,659 | A | * | 5/1995 | Ito ........................... 365/225.7 |
| 5,841,711 | A | | 11/1998 | Watanabe |
| 5,862,097 | A | | 1/1999 | Toda |
| 6,545,526 | B2 | | 4/2003 | Hönigschmid |
| 6,621,734 | B2 | * | 9/2003 | Hamaguchi et al. ... 365/185.09 |
| 6,781,887 | B2 | * | 8/2004 | Gelsomini et al. ..... 365/189.01 |

FOREIGN PATENT DOCUMENTS

| DE | 100 26 251 A1 | 12/2001 |
| DE | 100 26 253 A1 | 12/2001 |

* cited by examiner

Primary Examiner—Van Thu Nguyen
Assistant Examiner—Tuan T. Nguyen
(74) Attorney, Agent, or Firm—Laurence A. Greenberg; Werner H. Stemer; Ralph E. Locher

(57) ABSTRACT

A method and a configuration for driving one-time operable isolation elements on a semiconductor chip store an item of isolation information for each isolation element to be operated on the chip. In which case, as soon as the isolation information item is present for an isolation element, a one-time operation on the isolation element is begun.

11 Claims, 2 Drawing Sheets

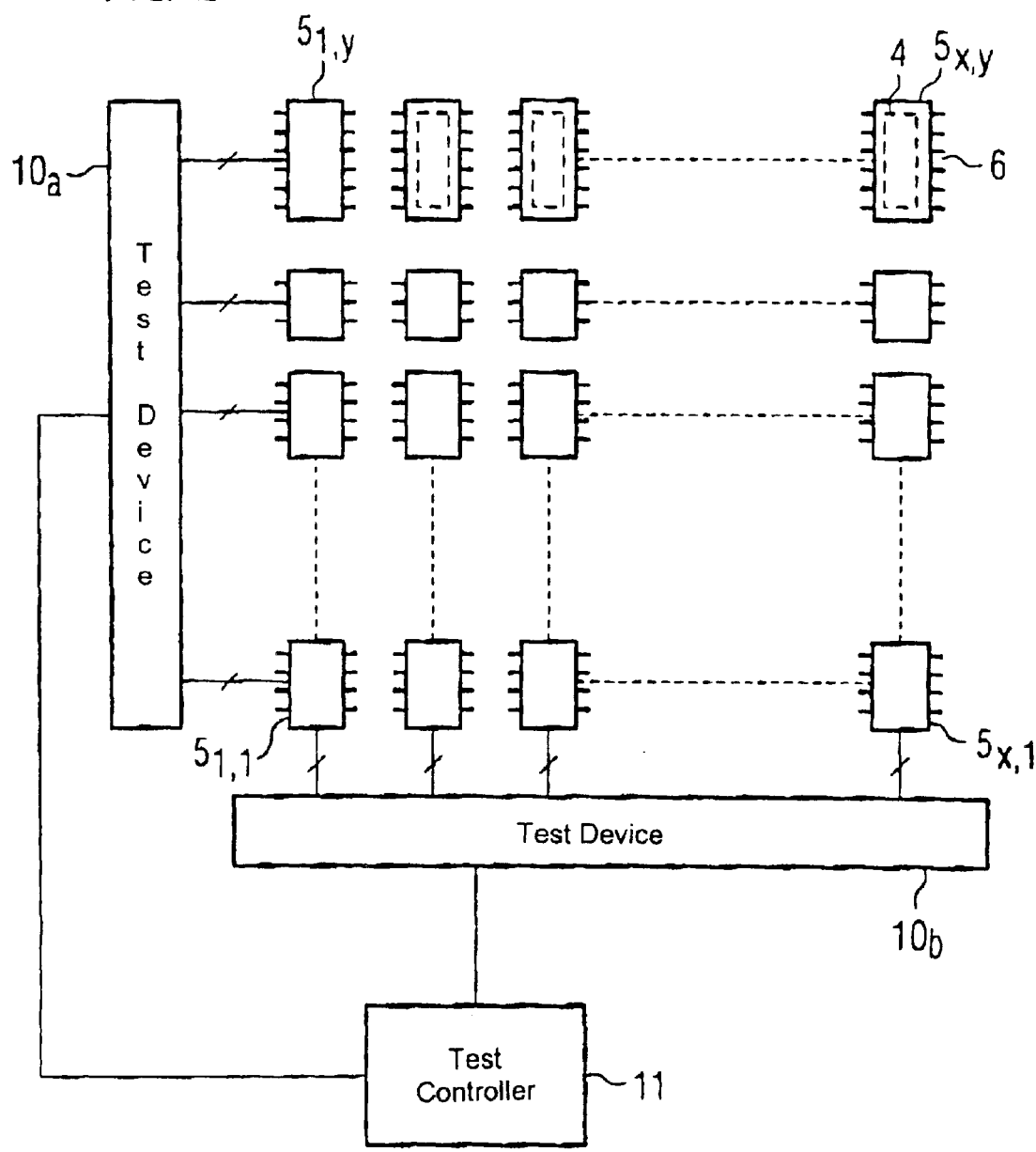

METHOD OF DRIVING ONE-TIME OPERABLE ISOLATION ELEMENTS AND CIRCUIT FOR DRIVING THE ISOLATION ELEMENTS

BACKGROUND OF THE INVENTION

FIELD OF THE INVENTION

The invention relates to a method for driving one-time operable isolation elements on a semiconductor chip, in which an item of isolation information is stored for each isolation element to be operated.

Isolation elements are usually used in a semiconductor configuration and in particular in semiconductor memories with increasing importance. They serve for connecting in corresponding replacement or redundant elements in the event of failure of individual elements, such as memory cells or word lines, for example. By way of example, if a word line is found to be defective during a test of a semiconductor memory, then a redundant word line is activated instead of the defective word line by the isolation or firing of so-called fuses. Moreover, chip options or individualizations, for example, can be switched by isolation elements of this type. There are two different types of isolation elements. In a first type, the isolation is effected by the action of a laser beam, with the result that a so-called "laser fuse" is present. In the second type, the isolation is achieved by electrical destruction on account of a corresponding isolation structure. One possibility is for an interconnect to be melted away through the evolution of heat. Another possibility is for electromigration to result in migration of a constituent of the material of the interconnect and thus in a change in the electrical resistance of the interconnect. So-called "antifuses" are yet another possibility, in the case of which, through the application of an electrical voltage, a dielectric is destroyed and a conductive channel is formed by this. A so-called electrical or "E-fuse" is taken as a basis hereinafter.

The so-called "laser fuses" have the disadvantage that they can only be activated on the open chip, i.e. severed by a laser. The invention that will be described below is employed for use with so-called "E-fuses". With "E-fuses" as the isolation element, a distinction is again made between those that are switched on by the application of an electrical voltage and those that are switched off by the application of an electrical voltage. Isolation elements which are switched on by the application of an electrical voltage, that is to say undergo transition to a conducting state, are referred to as "antifuses", while isolation elements which lose their conducting state through the application of the voltage are so-called normal "E-fuses".

The invention can be applied to both types. The state of the isolation element, that is to say "conducting" or "non-conducting", can be assigned a logic "1" or "0" or vice-versa.

The isolation elements are blown in particular by the application of a high voltage, which may amount to a few volts and is connected to one terminal of the isolation element, while the other terminal of the isolation element is connected to "ground". While Published, Non-Prosecuted German Patent Application No. DE 100 26 253 A1, corresponding to U.S. Pat. No. 6,545,526, describes a configuration for the read-out of "laser fuses", which can equally well be applied to "E-Fuses" or "antifuses", Published, Non-Prosecuted German Patent Application No. DE 100 26 251 A1, describes a configuration for programming a so-called "E-fuse". Configurations of this type are formed on the semiconductor chip. In principle, in the event of the necessary activation of redundancies on account of defective memory cells, for example in DRAM components, in principle an item of information about which an isolation element is to be activated is present for this purpose. The basis for this is, by way of example, a test that is performed by a corresponding test configuration on the chip still present on the so-called "wafer" or on the housed chip. Once the test device has determined which isolation element is to be activated, it transmits the information in this respect to the chip, irrespective of whether it is still disposed on the wafer or is already present in a housed component. The individual isolation elements are then subsequently activated on the information thus present on the chip.

This can mean that the time for activating the isolation elements assumes considerable dimensions. The number of isolation elements ranges between 10,000 and 20,000 individual isolation elements for example for a 256-Mbit chip. If all of the individual isolation elements are activated successively, then the time required for this mounts up. Although not all the isolation elements are necessarily activated, the number should usually be in the region of half of the available isolation elements, since the time for activating an individual isolation element, i.e. for severing a so-called "E-fuse", is in the region of 100 $\mu$ seconds. Therefore, the sequential severing of the isolation elements takes approximately 5 seconds in the case of a 256-Mbit chip. Since the memory chip is a mass-produced product, this comparatively long time has a disturbing effect on production, i.e. increases costs. In principle, the isolation elements could be driven in parallel in order to reduce the activation time of the isolation elements. However, since, as has already been described above, an amount of energy is necessary in order either to interrupt an interconnect or to sever a dielectric by the current flow in the case of the "antifuse", in order to produce a short-circuit, and this energy has to be made available on the "chip", driving the isolation elements in parallel has proved not to be very effective.

SUMMARY OF THE INVENTION

It is accordingly an object of the invention to provide a method for driving one-time operable isolation elements and a circuit for driving the isolation elements that overcome the above-mentioned disadvantages of the prior art methods and devices of this general type, in which the time required for activating the isolation elements is reduced.

With the foregoing and other objects in view there is provided, in accordance with the invention, a method for driving one-time operable isolation elements of a semiconductor chip. The method includes storing an item of isolation information in the semiconductor chip for each of the isolation elements to be operated on, and beginning a one-time operation on a respective isolation element upon reception of the item of isolation information for the respective isolation element.

By virtue of the fact that, as soon as an item of isolation information is present for an isolation element, the activation of the isolation element is begun and there is no waiting for the end of the storage of the isolation information, the activation of the isolation element can already be begun while the storage operation is still running. In this way, even with an individual component, the time for storing the isolation information is no longer relevant in the overall sequence. If a plurality of chips are processed successively by this method, then it is advantageous that, after the storage and the beginning of the activation of the first isolation element in the first chip, after a partial information item, i.e. the isolation information for at least one isolation element, is stored, the storage is begun for the next chip. If the thus extended method is used to operate a number of chips or components which is such that the sum of the time required for storing an item of isolation information for an isolation element corresponds to the time required for activating an individual isolation element, only the time for storing the isolation information is crucial for the duration of the entire operation. It may be expedient for optimizing the time saving, particularly if the chips are still present on the "wafer", to carry out a plurality of such series once again in parallel. Therefore, the isolation information begins to be stored in parallel for a plurality of chips and, as soon as the isolation information for a first isolation element is present, the activation of the isolation element is begun in order then to continue in each of the parallel series with this method for the next chip in the series.

It is equally possible to switch a plurality of series one after the other. In such a case, a temporal optimization is once again achieved, for example, if the sum of the reading-in of the isolation information for two isolation elements corresponds to the sum of the activation of two isolation elements for all the chips in a series.

In this case, the storage of the isolation information can be affected by the feeding of the isolation information from an external device to the respective chip, and equally by the initiation of an operation that generates the isolation information itself on the chip. This is possible since it is customary nowadays both to test and evaluate memory chips by use of external apparatuses and to carry out tests that are initiated by an external apparatus on the chip.

In this case, all the circuit configurations necessary for the test are integrated on the chip, so that the isolation information is generated by the chip itself.

With the foregoing and other objects in view there is provided, in accordance with the invention, a circuit configuration for operating on an isolation element. The circuit contains an interface, a first control line connected to the isolation element, and a buffer memory connected to the interface and receives an item of isolation information through the interface. The item of isolation information relates to the isolation element to be operated on. An isolation element driver is connected to the buffer memory and to the first control line. The isolation element driver reads the item of isolation information from the buffer memory and effects a one-time operation on the isolation element through the first control line upon a presence of the item of isolation information for the isolation element being stored in the buffer memory.

Other features which are considered as characteristic for the invention are set forth in the appended claims.

Although the invention is illustrated and described herein as embodied in a method for driving one-time operable isolation elements and circuit for driving the isolation elements, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block diagram of a configuration for carrying out a method in a case of a plurality of housed components.

DESCRIPTION OF THE PREFERRED EMBODIMENTS

Figure 1:
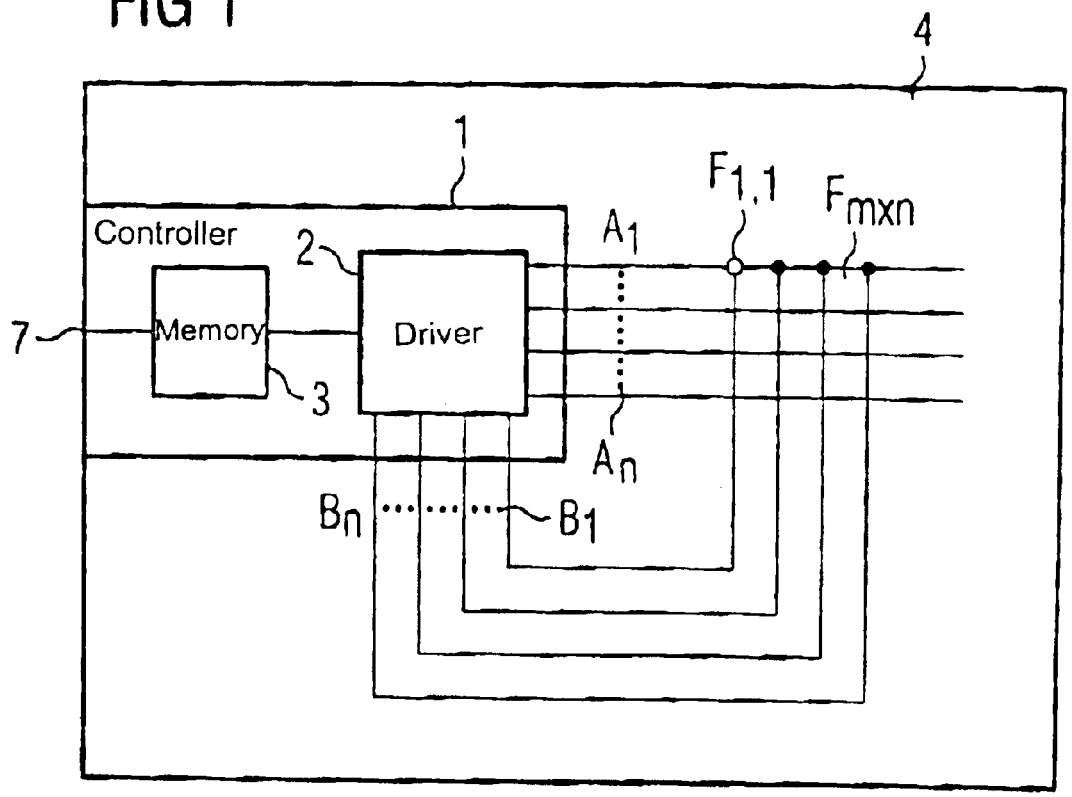
FIG. 1 is a block diagram of an exemplary embodiment of a circuit configuration for carrying out a method according to the invention.

Referring now to the figures of the drawing in detail and first, particularly, to FIG. 1 thereof, there is shown a semiconductor chip 4 having an isolation element controller 1. First fuse lines A1 to Am and second fuse lines B1 to Bn lead from the isolation element controller 1. The lines are provided for driving a matrix F of isolation elements, so that a respective isolation element can be driven, i.e. can be activated, at the point of intersection of the first and second fuse lines. The matrix F thus contains m×n isolation elements. In this case, it is not necessary for the isolation elements actually to be disposed on the chip spatially as a matrix. The illustration serves only to afford a better understanding.

As an alternative, it is also possible, of course, for the activation of the individual isolation elements, to provide an individual control line for each isolation element. This is advantageous particularly when only a small number of isolation elements are provided on a chip.

In the example illustrated in accordance with FIG. 1, the individual isolation elements are activated individually by an isolation element driver 2. For this purpose, the isolation element driver 2 is connected to a buffer memory 3 in which an item of isolation information can be stored. In the exemplary embodiment illustrated, the isolation information is input into the buffer memory 3 via an interface 7. However, it is not absolutely necessary for the interface 7 actually to be led from the chip, or to be led from the housing in the case of a housed component; the interface 7 may equally well be connected to an internal circuit configuration that generates the isolation information directly on the chip. As soon as an item of isolation information is then present for an individual isolation element of the matrix F, for example $F_{1,1}$, the isolation element driver 2 activates the isolation element $F_{1,1}$ via the first fuse line A1 and the second fuse line B1, so that the "E-fuse" or "antifuse" connected therewith is severed or short-circuited. As soon as this operation is concluded, the isolation element driver 2 reads out the next item of isolation information from the buffer memory 3 and continues the method until no further isolation information is fed to it via the buffer memory 3.

In a configuration in accordance with FIG. 2, the illustration shows a multiplicity of housed components 5 from which external terminals 6 are led, illustrated diagrammatically, a chip 4 being shown to be situated internally by a broken line. A number x×y of the components is thus present. By a test device illustrated in two parts 10a, 10b, an item of isolation information then begins to be fed first to the component $5_{1,1}$, which internally has, in principle, the configuration in accordance with FIG. 1, the interface 7 being realized by one or more of the external terminals 6.

As soon as the isolation information for a first isolation element is stored in the component $5_{1,1}$, the isolation element driver 2 begins to activate a first isolation element within the component 5, while the test device $10_{a,b}$ begins to store the isolation information in a component $5_{1,2}$ so that the activation likewise begins in this component. The procedure continues in this way up to the component $5_{1,y}$. If, after the storage of the isolation information in the component $5_{1,y}$, the previously begun operation of activation of an isolation element is concluded in the component $5_{1,1}$, it is possible to continue with the further storage of a next item of isolation information in the component $5_{1,1}$ and to continue correspondingly in the manner described above. It is then readily conceivable that the operation described for the components $5_{1,1}$ to $5_{1,y}$ proceeds in parallel for all the x-columns of components.

It is equally conceivable that if, during the storage of the isolation information at the component $5_{1,y}$, the activation of the isolation element has not yet concluded in the component $5_{1,1}$, the procedure continues with the operation of storage at the component $5_{2,1}$. It is then not absolutely necessary to then continue the storage of the items of isolation information in all the components of the second row, i.e. up to the component $5_{2,y}$. Assuming that a test controller 11 which is connected to the test device $10_{a,b}$ and controls the latter is suitable, it is possible to select an arbitrary suitable sequence of components which does not necessarily contain complete rows or columns. And it is equally possible, with a test controller 11 equipped in this way, to process in parallel a plurality of sequences of components of suitable length.

Figure 3:
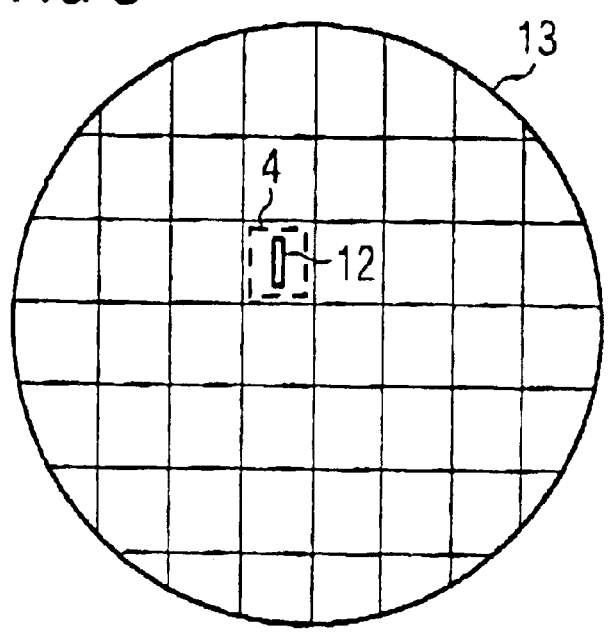
FIG. 3 is a plan view of a semiconductor wafer.

This method, which has been described on the basis of finished housed components in accordance with FIG. 2, can also be applied to a semiconductor wafer 13, illustrated diagrammatically in FIG. 3.

The lines on the wafer 13 that are illustrated in FIG. 3 are intended to represent the so-called sawing lines, a larger number of sawing lines and thus a larger number of individual chips 4 being formed in reality on the wafer 13. A contact/logic region 12 is indicated diagrammatically in a central region of the chip 4, in which contact/logic region there is disposed, by way of example, inter alia, the circuit configuration illustrated in principle in FIG. 1, in many cases terminal contacts likewise being formed in the contact/logic region 12. The test device is placed on the terminal contacts and makes contact with the contacts via so-called needles. The method described with reference to FIG. 1 or FIG. 2 can then be applied to one or as many chips 4 as desired on the wafer 13.

I claim:

1. A method for driving one-time operable isolation elements of a semiconductor chip, which comprises the steps of:

storing an item of isolation information in the semiconductor chip for each of the isolation elements to be operated on; and beginning a one-time operation on a respective isolation element upon reception of the item of isolation information for the respective isolation element.

2. A method for driving: one-time operable isolation elements of semiconductor chips, which comprises the steps of:

storing an item of isolation information in the semiconductor chips for each of the isolation elements to be operated on; and beginning a one-time operation on a respective isolation element upon reception of the item of isolation information for the respective isolation element.

3. The method according to claim 2, which further comprises:

storing a first item of isolation information specific to each of the semiconductor chips beginning in an initial semiconductor chip and then successively to further semiconductor chips and then to a last semiconductor chip for a first isolation element; and storing a second item of isolation information for a second isolation element in the first semiconductor chip and continuing the storing of the second item of isolation information until the second item of isolation information has been stored in all the semiconductor chips after the last semiconductor chip receives the first item of isolation information.

4. The method according to claim 2, which further comprises storing the item of isolation information specific to each of the semiconductor chips in parallel for all of the semiconductor chips.

5. The method according to claim 3, which further comprises transmitting the first and second items of isolation information from a test device to the semiconductor chips through an interface.

6. The method according to claim 4, which further comprises transmitting the item of isolation information from a test device to the semiconductor chips through an interface.

7. The method according to claim 3, which further comprises effecting storage of the first and second items of isolation information such that the first and second items of isolation information are generated on a semiconductor chip itself.

8. The method according to claim 4, which further comprises effecting storage of the item of isolation information such that the item of isolation information is generated on a semiconductor chip itself.

9. The method according to claim 2, which further comprises forming the semiconductor chips integrally on a wafer.

10. The method according to claim 2, which further comprises disposing the semiconductor chips in a housed component.

11. A circuit configuration for operating on an isolation element, comprising:

an interface;

a first control line connected to the isolation element;

a buffer memory connected to said interface and receiving an item of isolation information through said interface, the item of isolation information relating to the isolation element to be operated on; and an isolation element driver connected to said buffer memory and to said first control line, said isolation element driver reading the item of isolation information from said buffer memory and effecting a one-time operation on the isolation element through said first control line upon a presence of the item of isolation information for the isolation element being stored in said buffer memory.

* * * * *